US005666073A

United States Patent [19]
Kruse

[11] Patent Number: 5,666,073
[45] Date of Patent: Sep. 9, 1997

[54] POWER DISSIPATION LIMITER FOR HIGH FREQUENCY SWITCH

[76] Inventor: Neils A. Kruse, 7415 Cove Dr., Cary, Ill. 60013

[21] Appl. No.: 511,269

[22] Filed: Aug. 4, 1995

[51] Int. Cl.$^6$ ..................................................... G01R 23/02
[52] U.S. Cl. ............................................. 327/48; 327/142
[58] Field of Search .............................. 327/21, 378, 47, 327/379, 48, 389, 49, 392, 142, 419; 377/51, 107, 114

[56] References Cited

U.S. PATENT DOCUMENTS

| | | | |
|---|---|---|---|
| 3,521,197 | 7/1970 | Broderick | 33/13 |
| 3,534,276 | 10/1970 | Berteaud et al. | 333/17 |
| 3,757,233 | 9/1973 | Dixon | 327/49 |
| 3,769,528 | 10/1973 | Chu et al. | 307/270 |
| 4,002,984 | 1/1977 | Streckenbach | 327/48 |
| 4,084,127 | 4/1978 | Tults | 327/49 |
| 4,146,829 | 3/1979 | Rinaldi | 320/13 |
| 4,211,982 | 7/1980 | Smith | 327/49 |
| 4,239,990 | 12/1980 | Hong et al. | 307/262 |
| 4,360,782 | 11/1982 | Nowell | 327/48 |
| 4,400,661 | 8/1983 | Duley | 323/275 |
| 4,530,026 | 7/1985 | Noro | 361/88 |
| 4,622,481 | 11/1986 | Nortrup | 327/49 |
| 4,791,544 | 12/1988 | Gautherin et al. | 363/49 |
| 5,012,492 | 4/1991 | Sexton et al. | 327/49 |
| 5,300,900 | 4/1994 | Bellantoni | 333/17.2 |

Primary Examiner—Timothy P. Callahan
Assistant Examiner—Jeffrey Zweizig

[57] ABSTRACT

The command input of a high frequency switch is gated with the output of a power dissipation limiter. The limiter includes a counter that counts pulses of the command input. Between regularly occurring reset pulses, if a pulse count is obtained that indicates a burst period above a normal threshold level, the limiter generates a fault signal that inhibits further operation of the high frequency switch until the next regularly occurring reset pulse.

10 Claims, 2 Drawing Sheets

POWER DISSIPATION LIMITER

POWER DISSIPATION LIMITER FOR HIGH FREQUENCY SWITCH

FIELD OF THE INVENTION

The present invention relates to power limiters, and more particularly to a power limiting circuit that disables a high frequency switch in the event the switch attempts operation above a preselected frequency.

BACKGROUND OF THE INVENTION

Electronic switching devices must be protected from excessive power switching application, operation at a switching frequency greater than the maximum average frequency must be limited to short periods of time. The short periods of operation are defined as burst periods. The burst period must decrease as the switching frequency increases. A graph of a typical operating curve is shown in FIG. 1.

In the illustrative typical example, reflected by the operating curve of FIG. 1, it will be observed that, at the operating frequency of 300 Khz, the burst period should be infinite for continuous operation of a high frequency switch. Examples of high frequency switches, to which the present invention pertains, include a traveling wave tube (TWT) modulator and a Q switch modulator. At frequencies greater than the operating point, the burst period will decrease to a minimum of approximately 8.6 µs at 5 Mhz. For the example given, the latter mentioned frequency is the maximum switching frequency at which the typical high frequency switch should operate. Above that frequency, power dissipation can destroy the switch. A typical burst requirement for a high frequency switch is operation at an elevated frequency of 1.1 Mhz for 39 µs. The input of a typical high frequency switch (command input) is a variable frequency and duty cycle pulse train.

BRIEF DESCRIPTION OF THE PRESENT INVENTION

In order to prevent the high frequency switch from operating at elevated frequencies, beyond a safe burst period, means must be provided for monitoring the burst period and inhibiting the command input to the high frequency switch for periodic durations beyond the allowable burst period.

In the present invention, the command input of a high frequency switch is gated with the output of a power dissipation limiter. The limiter includes a counter that counts pulses of the command input. Between regularly occurring reset pulses, if a pulse count is obtained that indicates a burst period above a normal threshold level, the limiter generates a fault signal that inhibits further operation of the high frequency switch until the next regularly occurring reset pulse. In this manner, the switch is prevented from operating beyond a preselected burst period, and consequently the switch is saved from destruction by excessive power dissipation.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 2:
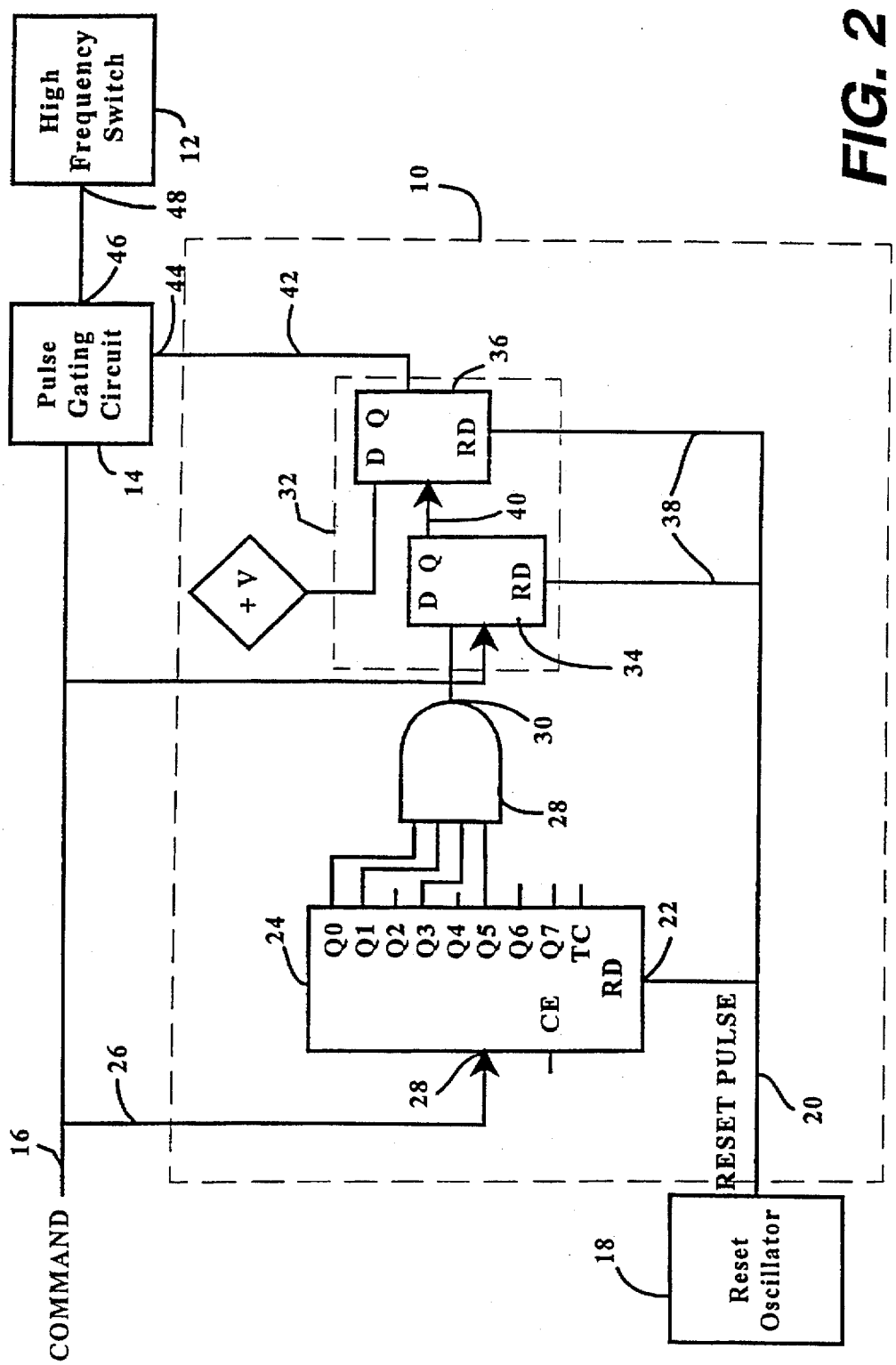
FIG. 2 is a block diagram of the present power dissipation limiter, as connected in the command input of a high frequency switch.

FIG. 2 illustrates the present power dissipation limiter, generally indicated by reference numeral 10. The purpose of this circuit is to limit power dissipation of a high frequency switch 12, such as the previously mentioned traveling wave tube (TWT) modulator or Q switch modulator. The input to the high frequency switch 12 is normally a command input along line 16, the input being a variable frequency and duty cycle pulse train. A pulse gating circuit 14 is introduced between the command input on line 16 and the high frequency switch 12, the power dissipation limiter being capable of generating a fault output for inhibiting gating of the command line through to the high frequency switch 12 for durations exceeding the burst period, as will be explained hereinafter.

A reset oscillator 18 operates at a constant frequency and generates a pulse train with regularly spaced reset pulses along reset line 20. Reset pulses are connected to the reset direct (RD) input 22 of a 256 reset direct binary counter 24. The clock input to the counter is connected in parallel, along line 26, to the command input 16. Preselected outputs from the counter are connected to the input of an AND gate 28. An output 30 of the AND gate goes high when a preselected count is obtained by the counter, before a subsequent reset pulse at reset input 22. An output at 30 triggers latch 32 comprised of two flip-flops 34 and 36. The first flip-flop 34 has its trigger input connected in parallel with the command input 16, while the direct input (D) is connected to output 30 of AND gate 28. The output Q of the first flip-flop drives the trigger input 40 of the second flip-flop 36. The direct input of the second flip-flop 36 is connected to a biased voltage (+V). Both flip-flops have their reset inputs 38 connected to the reset line 20. The output (Q) generates a fault output along line 42 when the input command frequency is greater than a specified threshold, corresponding to the count in counter 24, to which AND gate 28 responds. The burst period is the time interval between a reset pulse and a subsequently generated fault signal. When a fault signal, present on line 42, is presented to input 44 of pulse gating circuit 14, the command input 16 is inhibited from passing to the output 46 of the pulse gating circuit 14. Accordingly, there is no further driving input at input terminal 48 of the high frequency switch 12.

Figure 1:
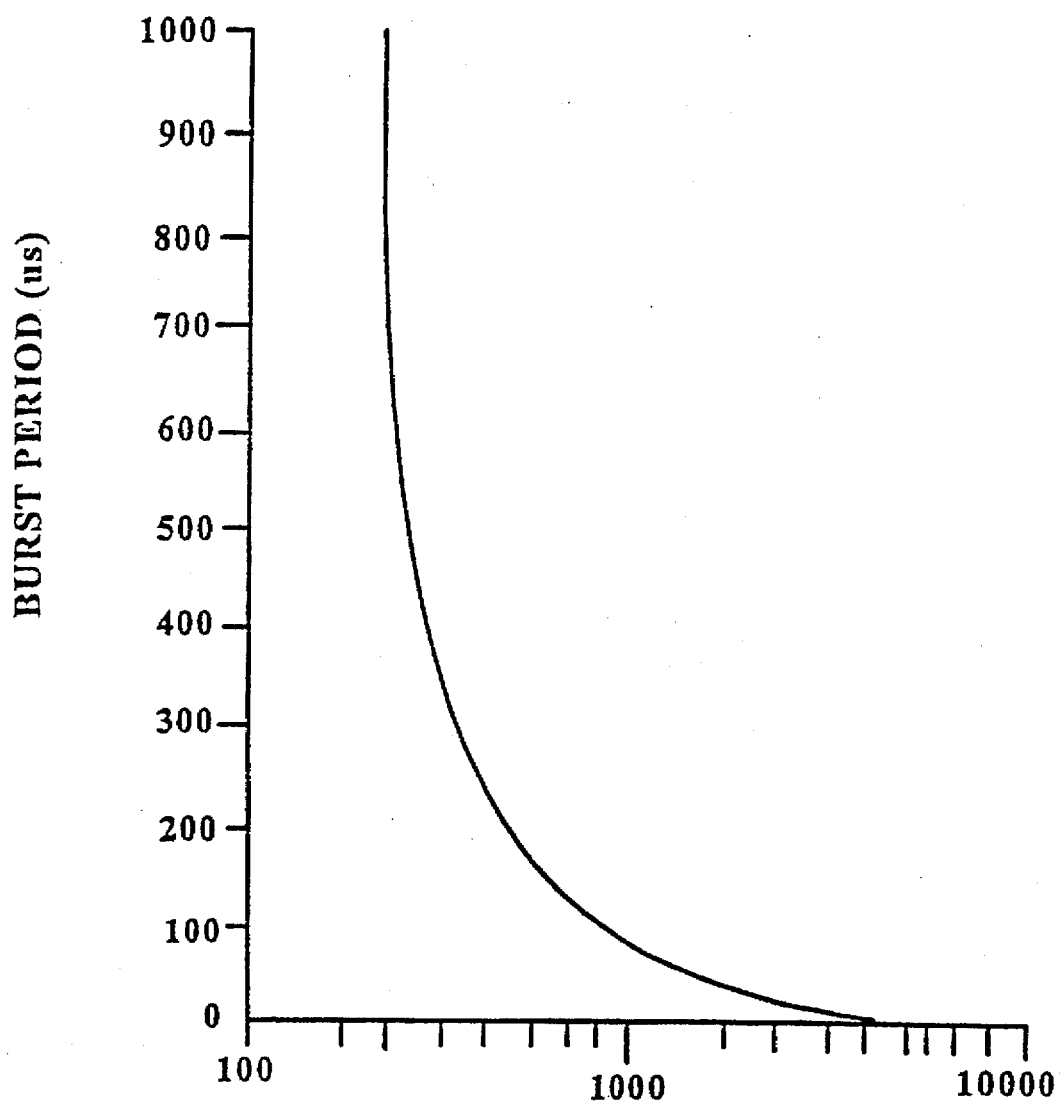
FIG. 1 is a plot of burst period as a function of frequency for a typical high frequency switch.

By way of example, at an operating frequency of 300 Khz shown in FIG. 1, the burst period is infinite for continuous operation without fault indication. At frequencies greater than the operating point, the burst period will decrease to a minimum of approximately 8.6 µs at 5 Mhz. 5 Mhz is the maximum switching frequency. A typical burst requirement is operation at 1.1 Mhz for 39 µs. This is equivalent to 43 pulses in 39 µs, since $$\frac{1}{1.1 \times 10^6} = .91 \times 10^{-6}; \frac{39 \times 10^{-6}}{.91 \times 10^{-6}} = 43.$$

The reset frequency will be the number of pulses in the burst divided by the operating frequency. This is 43/300 Khz or 143 µs for a 300 Khz operating frequency.

In operation of the limiter 10, after a reset pulse, the circuit will begin to measure the input frequency. The digital counter will set the latch, indicating a fault, if there have been 44 command pulses before the next reset pulse. The next reset pulse sets the counter to zero and resets the latch, clearing the fault. The reset frequency and number of command pulses can be changed for applications requiring a different operating curve.

Accordingly, the present invention offers a means for limiting the burst period of a high frequency switch, to normal levels of operation where excess power dissipation is avoided, thereby preventing destruction of a high frequency switch.

It should be understood that the invention is not limited to the exact details of construction shown and described herein for obvious modifications will occur to persons skilled in the art.

We claim:

1. A method for limiting power dissipation of a high frequency switch having a variable frequency command input, the method comprising:

counting pulses in each cycle of a command input signal;

periodically resetting the count to zero, at a constant frequency;

detecting the count at a preselected value, before resetting the count;

setting a latch upon the detection of the preselected value count;

generating a fault signal output from a set latch;

gating the fault signal and the command input signal together, to form a gated command input signal; and connecting the resulting gated command input signal to the command input of the high frequency switch for inhibiting switch operation until the count is reset to zero.

2. The method for limiting power dissipation set forth in claim 1 wherein the count detecting step is achieved by:

digitally counting pulses in a counter, during each cycle of a command input signal; and AND gating bits of the counter, corresponding to the count of the preselected value, to generate a gate output upon coincidence thereof.

3. The method for limiting power dissipation set forth in claim 1 wherein count reset is achieved by generating constant frequency reset pulses from a pulse oscillator.

4. The method for limiting power dissipation set forth in claim 1 wherein the count of the preselected value corresponds to the number of pulses in a burst period for a preselected operational command input frequency.

5. The method for limiting power dissipation set forth in claim 1 wherein the high frequency switch performs modulation for a travelling wave tube.

6. The method for limiting power dissipation set forth in claim 1 wherein the high frequency switch performs modulation for a Q switch.

7. The method for limiting power dissipation set forth in claim 4 wherein the reset frequency is equal to the number of pulses occurring during a burst period divided by a preselected normal operational frequency where the burst period is infinite.

8. A power dissipation limiter for a high frequency switch having a variable frequency command input, the limiter comprising:

means for counting pulses in each cycle of a command input signal;

means for periodically resetting the count to zero at a constant frequency;

means for detecting the count at a preselected value, before resetting of the count;

latch means that set upon the detection of the preselected value count for generating a fault signal output;

means for gating the fault signal and the command input signal together, to form a gated command input signal; and means connecting the resulting gated command input signal to the command input of the high frequency switch for inhibiting switch operation until the count is reset to zero.

9. A power dissipation limiter for a high frequency switch as set forth in claim 8 wherein the counting means comprises a reset direct binary counter.

10. A power dissipation limiter for a high frequency switch as set forth in claim 8 wherein the latch is comprised of two coupled reset direct flip-flops.

* * * * *